(12) United States Patent
Chen et al.

(10) Patent No.: US 9,607,433 B2
(45) Date of Patent: Mar. 28, 2017

(54) GEOMETRIC STRUCTURE ANALYZING METHOD, GEOMETRIC STRUCTURE ANALYZING SYSTEM, AND COMPUTER PROGRAM PRODUCT

(71) Applicant: National Taiwan University, Taipei (TW)

(72) Inventors: Bing-Yu Chen, Taipei (TW); Rong-Hao Liang, Taipei (TW); Liwei Chan, Taipei (TW); Hung-Yu Tseng, Taipei (TW); Han-Chih Kuo, Taipei (TW); Da-Yuan Huang, Taipei (TW)

(73) Assignee: National Taiwan University, Taipei (TW)

( * ) Notice: Subject to any disclaimer, the term of this patent is extended or adjusted under 35 U.S.C. 154(b) by 513 days.

(21) Appl. No.: 14/259,601

(22) Filed: Apr. 23, 2014

(65) Prior Publication Data

US 2015/0279096 A1    Oct. 1, 2015

(30) Foreign Application Priority Data

Mar. 27, 2014    (TW) .............................. 103111401 A (51) Int. Cl.
*G06T 17/20* (2006.01)
*G06T 7/60* (2006.01)
(Continued)

(52) U.S. Cl.
CPC .............. *G06T 17/20* (2013.01); *G01R 33/10* (2013.01); *G06T 7/0083* (2013.01);
(Continued)

(58) Field of Classification Search
CPC ................... G06T 17/20; G06T 17/205; G06T 2207/20044; G06T 2207/30136;
(Continued)

(56) References Cited

U.S. PATENT DOCUMENTS

| 2003/0032482 A1* | 2/2003 | Nagayama | .............. G06T 13/20 463/42 |
| 2011/0069866 A1* | 3/2011 | Kim | ................... G06K 9/00369 382/103 |

OTHER PUBLICATIONS

Kitamura, Yoshifumi, Yuichi Itoh, and Fumio Kishino. "Real-time 3D interaction with ActiveCube." CHI'01 extended abstracts on Human factors in computing systems. ACM, 2001.*
(Continued)

*Primary Examiner* — Daniel Hajnik
(74) *Attorney, Agent, or Firm* — Mintz Levin Cohn Ferris Glovsky and Popeo, P.C.; Peter F. Corless; Steven M. Jensen (57) ABSTRACT

A geometric structure analyzing method, a geometric structure analyzing system, and a computer program product are provided, to analyze a two-dimensional geometric structure of a model composed of at least one magnetic building block. A magnetic field intensity image of the model is obtained, and a shape of the magnetic field intensity image is used as a contour of the model. The contour of the model is skeletonized to obtain the two-dimensional geometric structure of the model, and the two-dimensional geometric structure is displayed on a display panel. Therefore, a user is allowed to control the two-dimensional geometric structure on the display panel by manipulating the model, to achieve interactive effects including visual and tactile feedbacks.

14 Claims, 7 Drawing Sheets

(51) Int. Cl.
*G06T 7/00* (2017.01)
*G01R 33/10* (2006.01)

(52) U.S. Cl.
CPC .. *G06T 7/0091* (2013.01); *G06T 2207/20044* (2013.01); *G06T 2207/30136* (2013.01)

(58) Field of Classification Search
CPC .......................... G06T 7/0079–7/0097; G06K 9/00221–9/00315; G01C 11/00–11/34
See application file for complete search history.

(56) References Cited

OTHER PUBLICATIONS

Ichida, Hiroyasu, et al. "ActiveCube and its 3D Applications." IEEE VR. 2004.*
Jacoby, Sigal, et al. "Tangible user interfaces: Tools to examine, assess, and treat dynamic constructional processes in children with developmental coordination disorders." International Journal on Disability and Human Development 5.3 (2006): 257-264.*
Mayya, Niranjan, and V. T. Rajan. "Voronoi diagrams of polygons: A framework for shape representation." Journal of Mathematical Imaging and Vision 6.4 (1996): 355-378.*

* cited by examiner

GEOMETRIC STRUCTURE ANALYZING METHOD, GEOMETRIC STRUCTURE ANALYZING SYSTEM, AND COMPUTER PROGRAM PRODUCT

CROSS-REFERENCES TO RELATED APPLICATIONS

This application claims under 35 U.S.C. §119(a) the benefit of Taiwanese Application No. 103111401, filed Mar. 27, 2014, the entire contents of which is incorporated herein by reference.

BACKGROUND OF THE INVENTION

1. Field of the Invention

This invention relates to geometric structure analyzing techniques, and, more particularly, to a geometric structure analyzing method, a geometric structure analyzing system and a computer program product that employ magnetically sensing techniques to analyze a geometric structure of a magnetic building block.

2. Description of Related Art

Recently, a variety of man-machine interfaces are brought to the market. Users are allowed to use these man-machine interfaces in a natural, intuitive manner to interact with electronic apparatuses. In addition to receiving visual feedbacks from a display panel, a user can also obtain abundant tactile feedbacks through manipulation of digital information displayed on the display panel with a material object. For example, substantial building blocks in a man-machine interaction system can be used as operation media, and a user is allowed to manipulate a digital model of the substantial building blocks displayer on the display panel. However, the substantial building blocks cannot be used as the operation media until the substantial building blocks are sensed, a geometric structure of the substantial building blocks is analyzed, and the substantial building blocks are transferred into a digital model displayed on a display panel.

The existing techniques that sense the substantial building blocks cannot effectively and accurately analyze a geometric structure of the substantial building blocks. For example, an optical camera detects a material of the substantial building blocks, and construct a digital model of the substantial building blocks. However, the building blocks that are held by the user's hand are covered, and usually cannot be detected correctly. Moreover, the optical camera requires that the substantial building blocks be made of certain materials in order for the substantial building blocks to be detected by the optical camera. However, such certain materials likely cover the pictures displayed on the display panel, which adversely affects the interactivity. An active sensor can be installed in the substantial building blocks. However, the active sensor consumes power. Accordingly, the substantial building blocks, if installed with the active sensor, have a high manufacturing cost and need maintenance from time to time.

Therefore, it is necessary to provide a novel geometric structure analyzing technique that constructs a digital model of an object accurately, provides users with versatile and intuitive operation modes, and can solve the problem of the prior art that the model of an object cannot be constructed accurately if the object is covered.

SUMMARY OF THE INVENTION

The present invention provides a geometric structure analyzing method for analyzing a two-dimensional geometric structure of a model composed of at least one magnetic building block, the geometric structure analyzing method comprising: obtaining a magnetic field intensity image of the model, and using a shape of the magnetic field intensity image as a contour of the model; triangularly dividing the contour according to a first algorithm to obtain in the contour a plurality of end triangles, a plurality of normal triangles and a plurality of junction triangles; skeletonizing the end triangles, the normal triangles and the junction triangles according to a second algorithm to obtain a plurality of first skeletons and a plurality of first connecting points corresponding to the model; connecting the first connecting points in the junction triangles with one end of each of the first skeletons in the normal triangles neighboring the end triangles to obtain a plurality of second skeletons and a plurality of second connecting points; and cutting at least one of the second skeletons that is longer than the magnetic building block to form a plurality of third skeletons and at least one third connecting point, and trimming remaining ones of the second skeletons, thereby using the third connecting point, the second connecting points, the second skeletons and the third skeletons as skeletons and joints of the two-dimensional geometric structure of the model.

The present invention further provides a geometric structure analyzing system, comprising at least one magnetic building block, a magnetic field sensor that obtains a magnetic field intensity image of a model composed of the magnetic building block, and a calculating device that constructs a two-dimensional geometric structure of the model according to the magnetic field intensity image by using the geometric structure analyzing method and displays the two-dimensional geometric structure.

The present invention further provides a computer program product loadable into a machine to execute a geometric structure analyzing method that analyzes a two-dimensional geometric structure of a model composed of at least one magnetic building block, the computer program product comprising: a first program code that obtains a magnetic field intensity image of the model and uses a shape of the magnetic field intensity image as a contour of the model; a second program code that triangularly divides the contour according to a first algorithm to obtain in the contour a plurality of end triangles, a plurality of normal triangles and a plurality of junction triangles; a third program code that skeletonizes the end triangles, the normal triangles and the junction triangles according to a second algorithm to obtain a plurality of first skeletons and a plurality of first connecting points corresponding to the model; a fourth program code that connects the first connecting points in the junction triangles with an end of each of the first skeletons in the normal triangles neighboring the end triangles to obtain a plurality of second skeletons and a plurality of second connecting points; and a fifth program code that cuts at least one of the second skeletons that is longer than the magnetic building block to form a plurality of third skeletons and at least one third connecting point, and trims remaining ones of the second skeletons, thereby using the third connecting point, the second connecting points, the second skeletons and the third skeletons as skeletons and joints of the two-dimensional geometric structure of the model.

BRIEF DESCRIPTION OF DRAWINGS

The invention can be more fully understood by reading the following detailed description of the preferred embodiments, with reference made to the accompanying drawings, wherein.

DETAILED DESCRIPTION OF THE INVENTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

Figure 1:
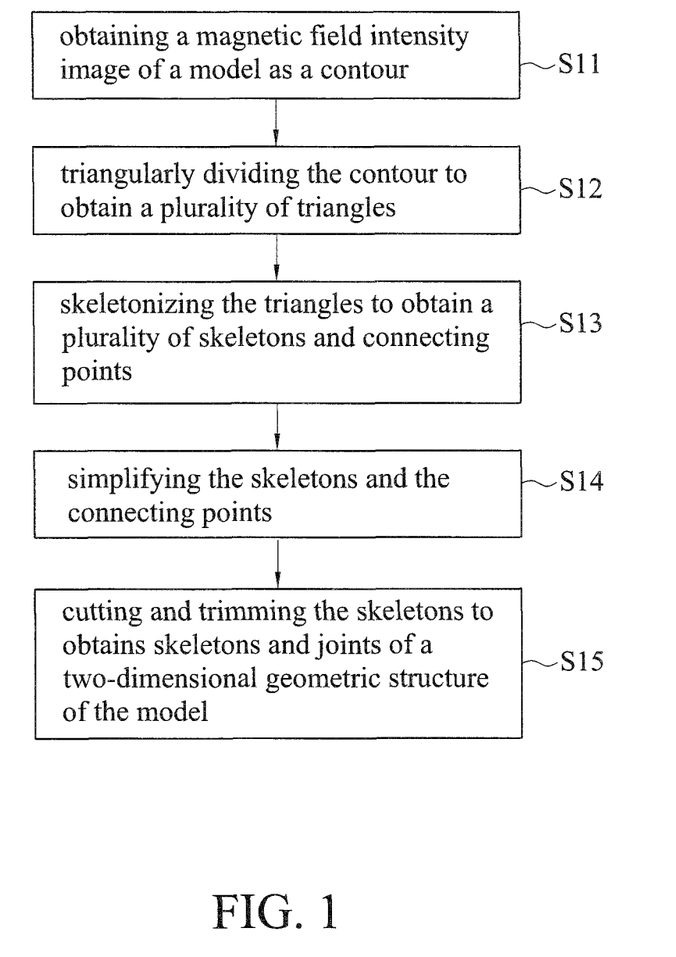
FIG. 1 is a flow chart of a geometric structure analyzing method of an embodiment according to the present invention.

FIG. 1 is a flow chart of a geometric structure analyzing method of an embodiment according to the present invention, including steps S11-S15. The geometric structure analyzing method analyzes a two-dimensional geometric structure of a model composed of magnetic building blocks. The two-dimensional geometric structure is represented by skeletons and joints. The geometric structure analyzing method is executed by a calculating device, such as a computer, a tablet computer, or a cellular phone.

In step S11, in order to obtain a shape of a magnetic field intensity image of the model as a contour of the model, the model composed of the magnetic building blocks is placed above a magnetic field sensor, for the magnetic field sensor to sense the magnetic field of the model and generate a magnetic field intensity image. A shape of the magnetic field intensity image is used as the contour of the model. Proceed to step S12.

In step S12, the contour is triangularly divided to obtain a plurality of triangles. The contour is triangularly divided into a plurality of triangles disposed in the contour according to a first algorithm. Therefore, the contour is composed of the triangles. In an embodiment, the first algorithm is Delaunay triangulation algorithm. The Delaunay triangulation algorithm triangularly divides a set of points on a plane, with no point that is contained in circumscribed circles of all triangles generated. Therefore, the contour of the model, which is operated by the Delaunay triangulation algorithm, is divided into a plurality of triangles composed of end triangles, normal triangles and junction triangles. Proceed to step S13.

In step S13, the triangles are skeletonized to obtain a plurality of skeletons and connecting points. The triangles are skeletonized according to a second algorithm, and the second algorithm has various skeletonization algorithm rules for different types of triangles. For the junction triangles, the second algorithm forms the first skeletons and the first connecting points by connecting a centroid of each of the junction triangles with medians of three edges of the junction triangle. In an embodiment, each of the end triangles, after skeletonized by the second algorithm, has three first skeletons and at least one first connecting point. For the normal triangles, the second algorithm forms the first skeletons and the first connecting points by connecting medians of two inner edges of each of the normal triangles. In an embodiment, each of the normal triangles, after skeletonized by the second algorithm, has one first skeleton and two first connecting points. For the end triangles, the second algorithm forms the first skeletons and the first connecting points by connecting medians of inner edges of each of the end triangles with a centroid of the end triangle. In an embodiment, each of the end triangles, after skeletonized by the second algorithm, has one first skeleton and two first connecting points. The inner edges of the triangles are those not being used as a portion of the contour of the model, and are not disposed on the contour of the model.

After the triangles are skeletonized by the second algorithm, the first skeletons and the first connecting points are connected to form skeletons and joints of a two-dimensional geometric structure corresponding to the model. However, before the obtained two-dimensional geometric structure of the model is used, steps S14 and S15 of simplification, cutting and trimming are to be executed, in order to form a two-dimensional geometric structure that is more similar to the shape of the model than the obtained two-dimensional geometric structure.

In step S14, the obtained first skeletons and first connecting points are simplified by connecting the first connecting point in the junction triangles with one end of each of the first skeletons in the normal triangles neighboring the end triangles to form a plurality of second skeletons and a plurality of second connecting points. Proceed to step S15.

In step S15, the second skeletons are cut and trimmed. At least one of the second skeletons that is longer than the magnetic building block is cut to form a plurality of third skeletons and at least one third connecting point, and remaining ones of the second skeletons are trimmed. The second skeletons that are not trimmed and the third skeletons form skeletons of the two-dimensional geometric structure of the model, and the second connecting points and the third connecting points are used as joints of the two-dimensional geometric structure of the model.

Figure 2:
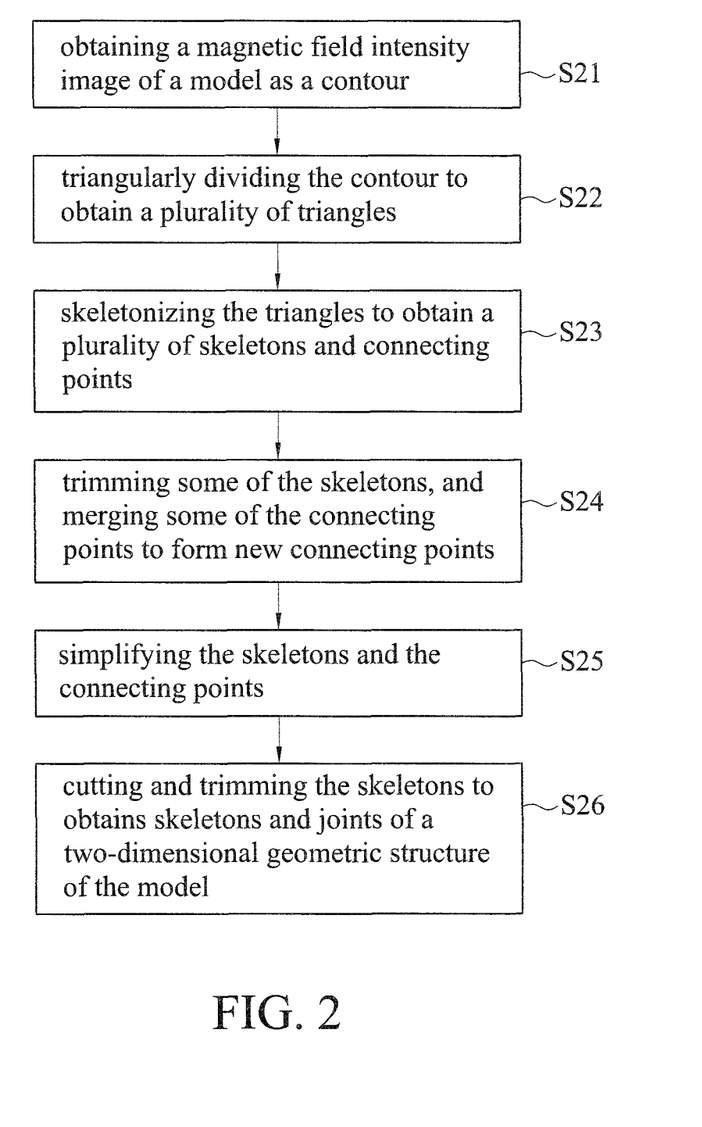
FIG. 2 is a flow chart of a geometric structure analyzing method of another embodiment according to the present invention.

FIG. 2 is a flow chart of a geometric structure analyzing method of another embodiment according to the present invention. The geometric structure analyzing method comprises steps S21-S26, which are described in details in accordance with FIGS. 3A-3H.

Figure 3A:
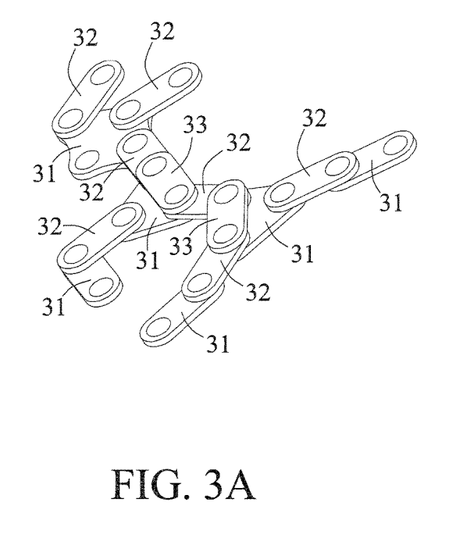
FIG. 3A is a schematic diagram of a model composed of a plurality of magnetic building blocks of an embodiment according to the present invention.
Figure 3B:
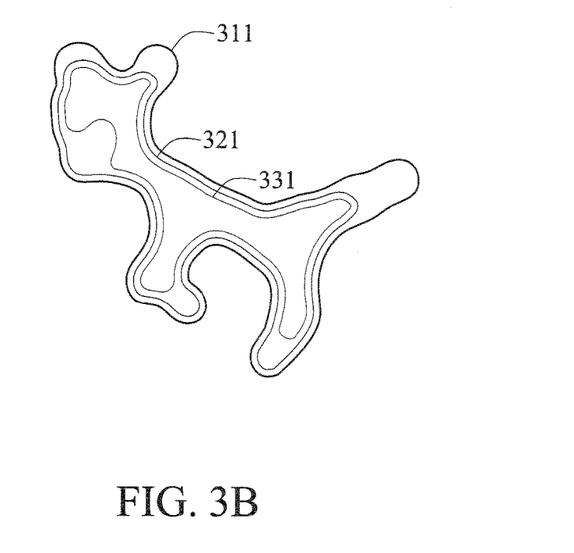
FIG. 3B is a schematic diagram of a magnetic field intensity image of the model shown in FIG. 3A.
Figure 3C:
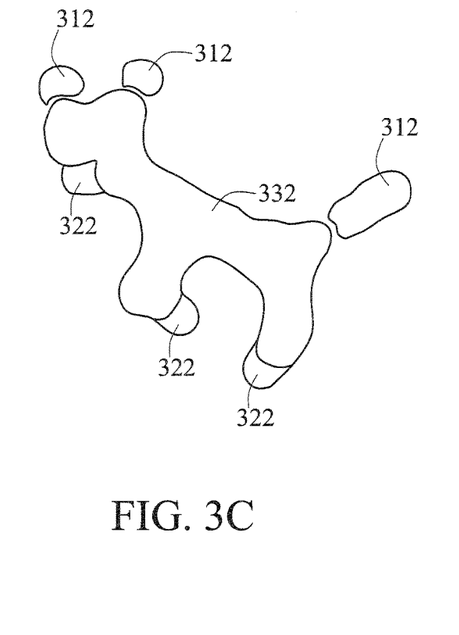
FIG. 3C is a schematic diagram of the magnetic field intensity image of FIG. 3B that has been cut.

In step S21, a shape of a magnetic field intensity image of the model is obtained and used as a contour of the model. In an embodiment, the model in step S21 is composed of a plurality of first magnetic building blocks 31, a plurality of second magnetic building blocks 32 and a plurality of third magnetic building blocks 33, as shown in FIG. 3A. Since the first magnetic building blocks 31, the second magnetic building blocks 32 and the third magnetic building blocks 33 have magnets installed therein, the building blocks can be stacked on one another by the magnetic forces, to construct a structure of any shape. For example, the model stacked in FIG. 3A represents a deer. The model composed of the first magnetic building blocks 31, the second magnetic building blocks 32 and the third magnetic building blocks 33 is placed above the magnetic field sensor, for the magnetic field sensor to sense the magnetic field of the model and generate a magnetic field intensity image of the model. In an embodiment, the magnetic field sensor generates a couple of magnetic field intensity images, since the magnetic forces around a region where the building blocks are stacked are greater than the magnetic forces around another region where the building blocks are not stacked. Therefore, the magnetic field intensity images generated are differentiated from one another by their magnetic force strength, and are distributed as a contour map. Please also refer to FIGS. 3A-3C. In an embodiment, the second magnetic field intensity image 321 is a contour formed by the first magnetic building blocks 31 adhered to the calculating device, and the third magnetic field intensity image 331 is a contour formed by a portion of the first magnetic building blocks 31 that has the second magnetic building blocks 32 stacked thereon. Since the second magnetic building blocks 32 are stacked on the first magnetic building blocks 31 and are connected to one another by magnetic forces, and the magnetic forces around a region where the building blocks are stacked are greater than another region where the building blocks are not stacked, the magnetic field intensity images generated are differentiated from one another by their magnetic force strength, and the magnetic field intensity images that have the same magnetic forces are grouped in the same region. Therefore, the magnetic force that generates the third magnetic field intensity image 331 is greater than the magnetic force that generates the second magnetic field intensity image 321, and the third magnetic field intensity image 331 that is different from the second magnetic field intensity image 321 is formed. In an embodiment, the third magnetic building blocks 33 can be further stacked on the second magnetic building blocks 32. However, some of the stacked second magnetic building blocks 32 do not have any first magnetic building block 31 disposed thereunder, one end of the second magnetic building block 32 is stacked on the first magnetic building block 31, and the other end of the second magnetic building block 32 is in a hanged state. In other words, the second magnetic building block 32 has one end that is hanged above the magnetic field sensor, rather than adhered to the calculating device, which results that the magnetic forces of the magnetic building blocks sensed by the magnetic field sensor are weaker than the magnetic forces of the magnetic building blocks that are adhered to the calculating device. As shown in FIG. 3B, as compared with the second magnetic field intensity image 321, the end of the first magnetic field intensity image 311 is the contour that is formed by the magnetic building blocks that have hanged ends. With respect to the magnetic force strength, the first magnetic field intensity image 311 has the least magnetic force, and the third magnetic field intensity image 331 has the greatest magnetic force. The magnetic field intensity image shown in FIG. 3B is divided, as shown in FIG. 3C. The divided magnetic field intensity images shown in FIG. 3C have a plurality of first magnetic field intensity images 312, a plurality of second magnetic field intensity images 322 and a plurality of third magnetic field intensity images 332. The first magnetic field intensity images 312 have the least magnetic forces, and the third magnetic field intensity images 332 have the greatest magnetic forces. After the magnetic field intensity images are obtained, the shapes of the magnetic field intensity images can be used as a contour of the model. In an embodiment, the shape of the first magnetic field intensity images 311 is used as the contour of the model. Alternatively, the shapes of all of the magnetic field intensity images shown in FIG. 3C, that are formed by dividing the magnetic field intensity image shown in FIG. 3B, are integrated into a contour 3 shown in FIG. 3D and used as the contour of the model.

Figure 3D:
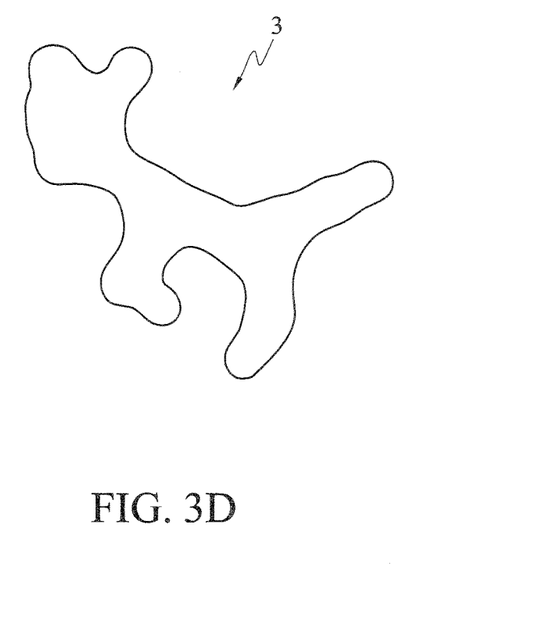
FIG. 3D is a schematic diagram of a contour of the model of FIG. 3C that has been contourized.
Figure 3E:
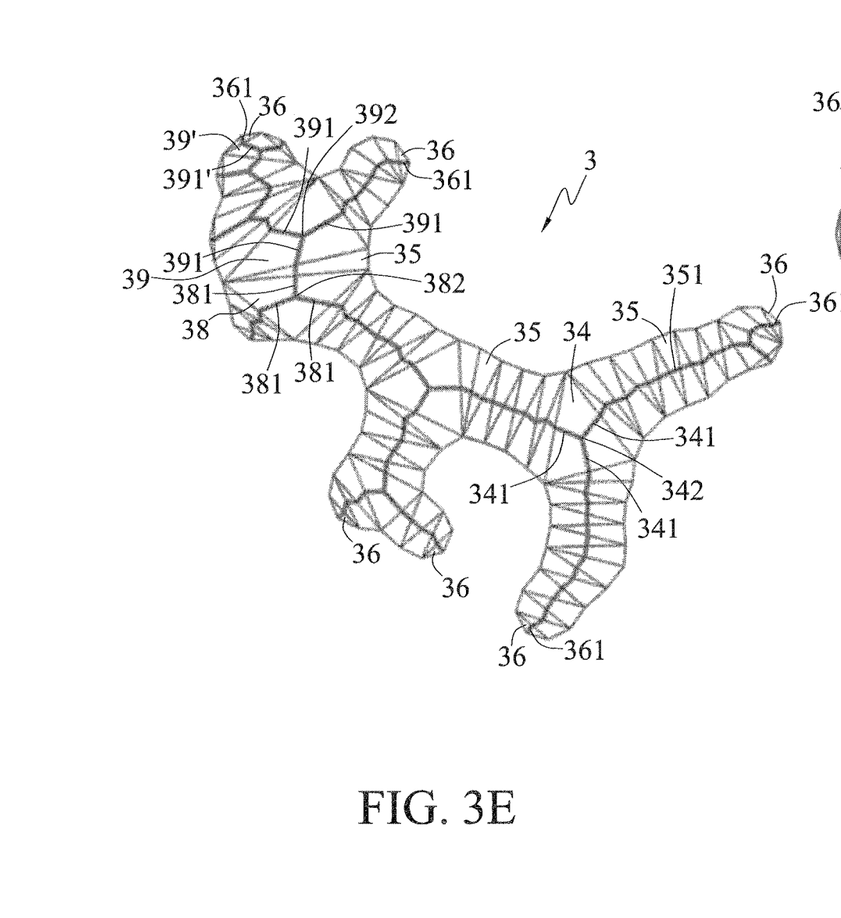
FIG. 3E is a schematic diagram of a contour of the model of FIG. 3D that has been triangularly divided.

The contour 3 shown in FIG. 3D is used as the contour described in step S21. In step S22, the contour 3 shown in FIG. 3D is triangularly divided to obtain a plurality of triangles. In an embodiment, the contour 3 is triangularly divided by Delaunay triangulation algorithm to obtain the triangles. As shown in FIG. 3E, the triangles comprise a plurality of normal triangles 35, a plurality of end triangles 36, and a plurality of junction triangles 34, 38 and 39.

In step S23, the normal triangles 35, the end triangles 36 and the junction triangles 34, 38 and 39 are skeletonized to obtain a plurality of skeletons and a plurality of connecting points. There are various skeletonization algorithm rules for different types of triangles. As shown in FIG. 3E, if the junction triangles 34 are skeletonized, a centroid of the junction triangle 34 is used as a first connecting point 342, and centroids of the junction triangles 38 and 39 are used as first connecting points 382 and 392. With regard to the junction triangle 34, three first skeletons 341 can be obtained by connecting the first connecting point 342 with medians of three edges of the junction triangle 34. With regard to each of the junction triangles 38 and 39, another three first skeletons 381 and 391 can also be obtained. In an embodiment, the three edges of the junction triangles 34, 38 and 39 are not disposed on the contour 3, and are referred to as three inner edges of the junction triangles 34, 38 and 39. The first connecting point 342 is the centroid of the junction triangle 34. Besides, the medians of three edges of the junction triangle 34 can also be used as the connecting points. After the normal triangle 35 is skeletonized, first skeletons 351 that are formed by connecting medians of two inner edges of the normal triangle 35 are obtained, and the medians of the two inner edges are used as the connecting points. After the end triangle 36 is skeletonized, first skeletons 361 that are formed by connecting medians of inner edges of the end triangle 36 with a centroid of the end triangle 36 are obtained, and the medians of the inner edges can also be used as the connecting points. Skeletons that represent the whole contour 3 can be formed by connecting the first skeletons 341, 351, 361, 381 and 391 of all the normal triangle 35, the end triangle 36 and the junction triangles 34, 38 and 39 through the first connecting points 342, 382 and 392, and the connecting points can be used as joints in the skeletons of the whole contour 3.

Figure 3F:
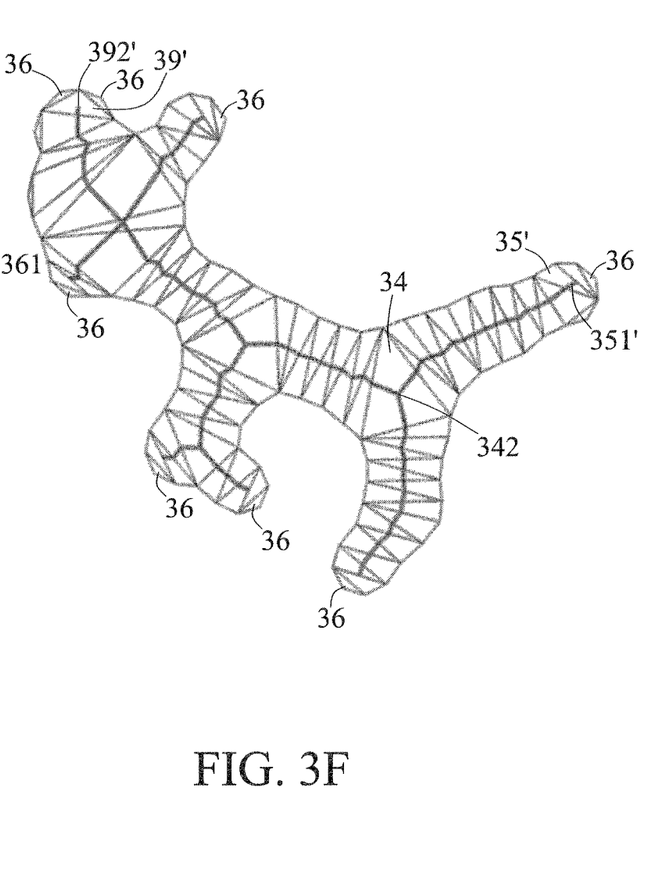
FIG. 3F is a schematic diagram of the contour of the model of FIG. 3E that has been skeletonized.

However, such skeletons and joints are not complete enough to represent the two-dimensional geometric structure of the contour 3. A trimming step has to be executed. In step S24, some of the skeletons are trimmed, and some of the connecting points are merged to form new connecting points. The trimmed skeletons are the first skeletons 361 disposed in the end triangles 36. In an embodiment, in addition to the first skeletons 361 in the end triangle 36, the first skeletons of the junction triangle or the normal triangle neighboring the end triangle 36 are also trimmed. For example, first skeletons 391' in the junction triangle 39' neighboring the end triangle 36 are trimmed, as shown in FIG. 3E. The remaining first skeletons in the junction triangle that are not connected with the first skeletons in the end triangle are not required to be trimmed. In addition to trimming some of the skeletons, some of the first connecting points are merged to form new first connecting points, wherein a number of triangles that are passed by connecting lines connected by the some of the first connecting points are less than a specific threshold. As shown in FIGS. 3E and 3F, a connecting line that connects the first connecting point 392 of the junction triangle 39 with the first connecting point 382 of the junction triangle 38 passes one normal triangle 35 only, and the first connecting points 382 and 392 can thus be merged to form a new first connecting point 37'. In an embodiment, a connecting line that connects the connecting points of two junction triangles can pass one or more than one normal triangles.

After step S24 is executed, step S25 is then executed. In step S25, the first skeletons and the first connecting points obtained previously are simplified by connecting the first connecting points disposed in the junction triangle with one end of each of the first skeletons in the normal triangles neighboring the end triangles to form a plurality of second skeletons and a plurality of second connecting points. In an embodiment, the first connecting point 392' shown in FIG. 3F is connected with the first connecting point 37', or the first connecting point 342 is connected with the first connecting point 351', so as to form second skeletons 300 and 301 and a second connecting point 302 shown in FIG. 3G. There may be a plurality of second skeletons and second connecting points.

Figure 3G:
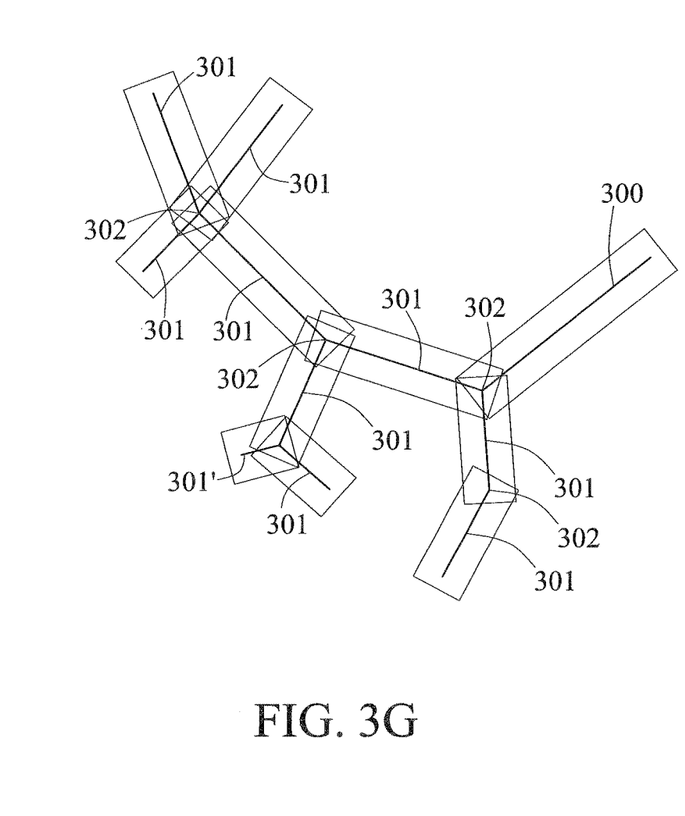
FIG. 3G is a schematic diagram of the contour of the model of FIG. 3F that has been simplified.
Figure 3H:
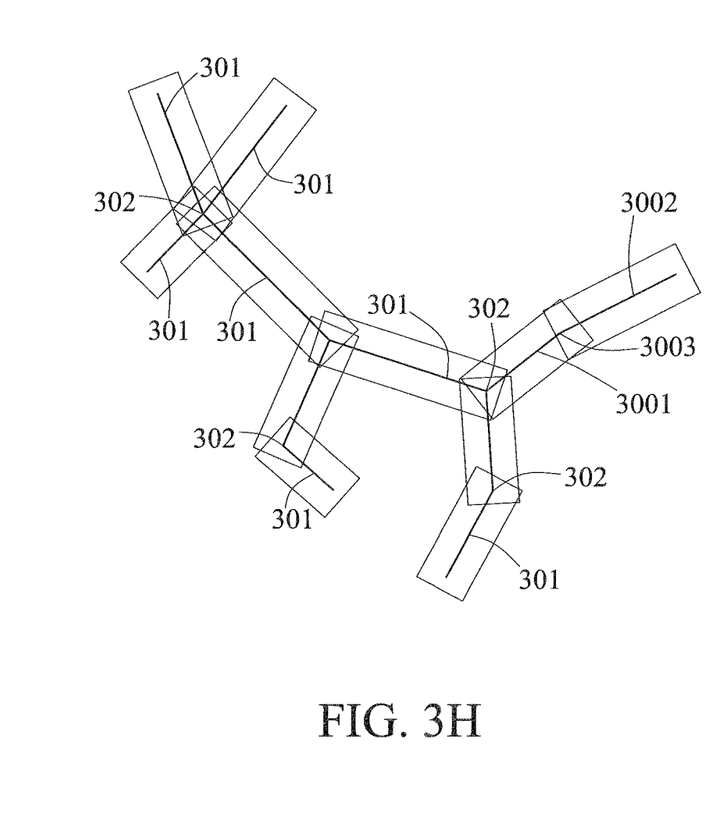
FIG. 3H is a schematic diagram of the contour of the model of FIG. 3G that has been cut and trimmed.

After step S25 is executed, step S26 is then executed. In step S26, at least one of the second skeletons that is longer than the magnetic building block is cut into a plurality of third skeletons and at least one third connecting point. In an embodiment, the second skeleton 300 shown in FIG. 3G is longer than the magnetic building block, and is cut into third skeletons 3001 and 3002 and a third connecting point 3003, as shown in FIG. 3H. In step S26, the remaining ones of the second skeletons that are shorter than the magnetic building block are trimmed. In an embodiment, the second skeleton 301' shown in FIG. 3G is shorter than the magnetic building block, and is thus trimmed. FIG. 3H shows the skeletons of a two-dimensional geometric structure of the model formed by the second skeleton 301 and the third skeletons 3001 and 3002 that are remained. The second connecting points 302 and the third connecting points 3003 can be used as joints of the two-dimensional geometric structure of the model.

Figure 4:
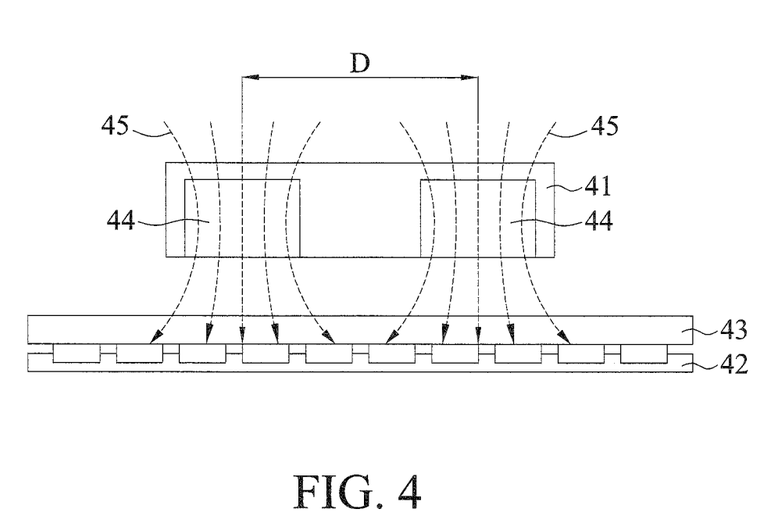
FIG. 4 is a schematic diagram of a geometric structure analyzing system of an embodiment according to the present invention.

The present invention further provides a geometric structure analyzing system that employs the above-described geometric structure analyzing method to construct a two-dimensional geometric structure of a model. As shown in FIG. 4, the geometric structure analyzing system comprises at least one magnetic building block 41, a magnetic field sensor 42, and a display panel 43. The display panel 43 is a calculating device that has a computing unit. In an embodiment, the display panel 43 is a tablet computer or a cellular phone. The computing unit can be software installed in the tablet computer or the cellular phone, and cooperates with a processor in the tablet computer or the cellular phone. The magnetic field sensor 42 is adhered to one side of the display panel 43. The magnetic building block 41 has at least two magnets 44 installed therein. In an embodiment, the magnetic building block 41 is a round-corner cuboid, and the two magnets 44 are kept at the same polarity and installed on two ends of the round-corner cuboid, respectively. In other words, the two magnets 44 generate magnetic fields that are in the same direction 45, and the direction 45 of the magnetic field is perpendicular to the display panel 43 or the magnetic field sensor 42. The two magnets 44 are spaced at a minimum distance D such that magnetic fields respectively generated by the two magnets 44 are merged to form a single magnetic field and a shape of a magnetic field intensity image of the two magnets 44 generated by the magnetic field sensor 42 is similar to a shape of the magnetic building block 41. Therefore, the magnetic field intensity image obtained by the magnetic field sensor 42 is similar to the shape of the magnetic building block, which facilitates further analysis.

Figure 5A:
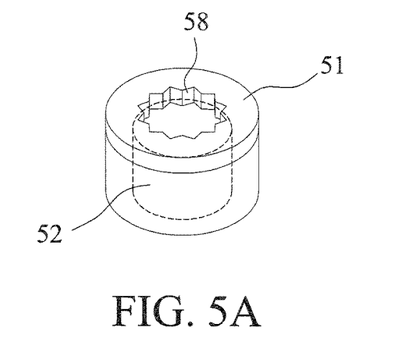
FIG. 5A is a schematic diagram of a first exemplary magnetic building block of an embodiment according to the present invention.
Figure 5B:
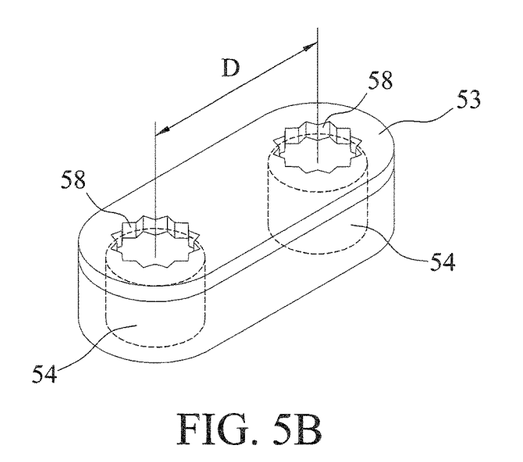
FIG. 5B is a schematic diagram of a second exemplary magnetic building block of an embodiment according to the present invention.
Figure 5C:
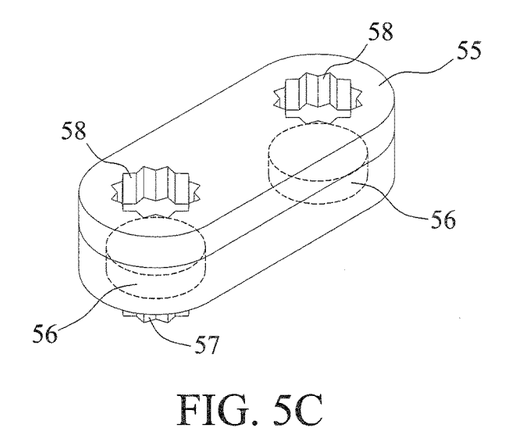
FIG. 5C is a schematic diagram of a third exemplary magnetic building block of an embodiment according to the present invention.

FIGS. 5A-5C describe the types of the magnetic building blocks. In the first exemplary magnetic building block shown in FIG. 5A, the magnetic building block 51 is a cylinder, and has a first magnet 52 installed therein. Gear-shaped female connectors 58 are disposed on an outer side of the magnetic building block 51 above the first magnet 52. The present invention does not limit the magnetic building block 51 to have the gear-shaped female connectors 58. In the second exemplary magnetic building block shown in FIG. 5B, the magnetic building block 53 is a round-corner cuboid, and two first magnets 54 are disposed on two ends of the round-corner cuboid, respectively. The two first magnets 54 are spaced at a minimum distance D such that the magnetic fields respectively generated by the two first magnets 54 are merged to form a single magnetic field, and a shape of the magnetic field intensity image is similar to a shape of the magnetic building block 53. Gear-shaped female connectors 58 are disposed on outer sides of the magnetic building blocks 53 above the two first magnets 54. The present invention does not limit the magnetic building block 53 to have the gear-shaped female connectors 58. In the third exemplary magnetic building block shown in FIG. 5C, the magnetic building block 55 is also a round-corner cuboid. Different from the magnetic building block 53, the magnetic building block 55 has two second magnets 56 installed therein, and the second magnets 56 are shorter than the first magnets 54, such that the magnetic forces of the second magnets 56 are less than the magnetic forces of the first magnets 54. Gear-shaped female connectors 58 are disposed on outer sides of the magnetic building blocks 55 above the two second magnets 56, and gear-shaped male connectors 57 are disposed on outer sides of the magnetic building blocks 55 under the two second magnets 56. In other words, the gear-shaped male connectors 57 and the gear-shaped female connectors 58 are disposed on two sides of at least one of the second magnets 56. The gear-shaped male connectors 57 and the gear-shaped female connectors 58 have corresponding sizes and numbers of teeth and can be engaged with each other. The gear-shaped male connectors 57 and the gear-shaped female connectors 58, when in operation to assemble the model, can apply different magnetic building blocks on demands. For example, in a region where joints are needed to be fixed the magnetic building block 55 is used, while in another region where joints are not needed to be fixed the magnetic building block 53 or the magnetic building block 51 is used. Through the model composed of the magnetic building blocks 51, 53 and 55, after the magnetic field sensor 42 obtains the magnetic field intensity image of the model, the geometric structure analyzing method according to the present invention can be used to construct the two-dimensional geometric structure of the model, and display the two-dimensional geometric structure on the display panel 43. In an embodiment, the first magnets 52 and 54 and the second magnet 56 are cylindrical neodymium magnets, the magnetic building blocks 51, 53 and 55 have a shape, such as a triangle, a cross or a rectangle, allowing at least three magnets to be installed thereon, and the magnetic building blocks 51, 53 and 55 are made of transparent acrylic.

The present invention further provides a computer program product, which comprises a plurality of program codes that are loadable into a machine (e.g., a calculating device) to execute the steps of the above-described geometric structure analyzing method, to analyze a two-dimensional geometric structure of a model composed of at least one magnetic building block.

Through the use of the geometric structure analyzing techniques according to the present invention, a two-dimensional geometric structure of an object can be constructed accurately and be displayed on a display panel. The two-dimensional geometric structure displayed on the display panel is changed as a user changes the shape of the model, which provides versatile and intuitive operation modes, and abundant visual feedbacks. The problem of the prior art that a two-dimensional geometric structure of an object cannot be constructed accurately if the object is covered is thus solved. The present invention has a variety of advanced applications, which are described as follows.

The first application of the present invention is to engage the magnetic building block with an actuator and to enable the actuator to control the deformation of the model composed of the magnetic building block. Therefore, the magnetic field intensity image can have its shape changed in accordance with the controlling of the actuator.

The second application of the present invention is to adhere a conductive tape on the magnetic building block such that the magnetic building block adhered with the conductive tape, when being placed on a calculation device (e.g., a tablet computer) having a touch panel, can perform a multi-touch function. For example, the model composed of the magnetic building blocks is in the shape of a cat, and placed on a tablet computer, and the magnetic field sensor that is adhered to one side of the tablet computer can sense the magnetic field intensity image of the model, and can construct and display the two-dimensional geometric structure of the cat on the tablet computer. Since the magnetic building block is adhered with the conductive tape, as the conductive tape is touched, equivalent to touching the tablet computer, the cat is also touched correspondingly and generates interactive actions representing that the cat is touched. Such interactive actions can be realized by software. Therefore, a user is thus provided with good interactive experience.

The third application of the present invention is to adhere a fiber optics bundle on the magnetic building block, allowing an image that is covered due to the placement of the magnetic building block on the tablet computer can be displayed through the fiber optics bundle on a surface of the magnetic building block. In equivalence, the magnetic building block also has a display capability.

The fourth application of the present invention is to take advantages of the same polarity of the magnets that are installed in the magnetic building block to assemble a flexible model architecture. Such flexibility employs the attraction forces and the repulsion forces of the magnets to achieve interactive effects. For example, the magnetic building blocks are arranged to form a circle, the circularly disposed magnetic building blocks can be compressed to lose their circle arrangement, and will be disposed circularly again due to the repulsion magnetic forces as they are no longer compressed.

The fifth application of the present invention is to take the advantage of the characteristic that the magnetic field intensity image of the model is changed as the magnetic forces have different strength, to allow a user to hold the model and interact with the model in a three-dimensional manner on the tablet computer. For instance, as the user moves the model away from the magnetic field sensor, the shape generated by the magnetic field sensor has a size reduced, since the magnetic force is decreased; as the model moves close to the magnetic field sensor, the shape generated by the magnetic field sensor has a size enlarged, since the magnetic force is increased. The user may adjust the attitude at which a plane is flying in an aircraft game by moving the model away from or close to the magnetic field sensor.

In addition to the above five applications, the present invention has many other applications.

In sum, the geometric structure analyzing techniques according to the present invention can accurately construct a two-dimensional geometric structure of an object having a magnet, and display the two-dimensional geometric structure on a display panel. A user is allowed to hold the model and control the shape or location of the model, and the two-dimensional geometric structure displayed on the display panel is changed accordingly, thereby providing the user versatile and intuitive operation modes and abundant visual feedbacks. The magnetic building block that achieves the above efficacy has the advantages of light weight, well enough portability, low manufacturing cost, containing no electronic components, and consuming no power. The magnetic force sensing modes are not interfered by light sources and humidity in the environment or contacts or covering by hands, and thereby provide very well sensing stability and can be mounted in a variety of electronic apparatuses. Therefore, the problem of the prior art that a two-dimensional geometric structure of an object cannot be constructed accurately if the object is covered is thus solved.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A geometric structure analyzing method for analyzing a two-dimensional geometric structure of a model composed of at least one magnetic building block, the geometric structure analyzing method comprising:
    obtaining a magnetic field intensity image of the model, and using a shape of the magnetic field intensity image as a contour of the model;
    triangularly dividing the contour according to a first algorithm to obtain in the contour a plurality of end triangles, a plurality of normal triangles and a plurality of junction triangles;
    skeletonizing the end triangles, the normal triangles and the junction triangles according to a second algorithm to obtain a plurality of first skeletons and a plurality of first connecting points corresponding to the model;
    connecting the first connecting points in the end triangles with one end of each of the first skeletons in the normal triangles neighboring the junction triangles to obtain a plurality of second skeletons and a plurality of second connecting points; and cutting at least one of the second skeletons that is longer than the magnetic building block to form a plurality of third skeletons and at least one third connecting point, and trimming remaining ones of the second skeletons, thereby using the third connecting point, the second connecting points, the second skeletons and the third skeletons as skeletons and joints of the two-dimensional geometric structure of the model.

2. The geometric structure analyzing method of claim 1, wherein the first algorithm is Delaunay triangulation algorithm.

3. The geometric structure analyzing method of claim 1, wherein the second algorithm forms the first skeletons and the first connecting points by connecting a centroid of each of the junction triangles with medians of three edges of the junction triangles, the second algorithm forms the first skeletons and the first connecting points by connecting medians of two inner edges of each of the normal triangles, and the second algorithm forms the first skeletons and the first connecting points by connecting a median of an inner edge of each of the end triangles with a centroid of the end triangles.

4. The geometric structure analyzing method of claim 1, further comprising, after the first skeletons and the first connecting points corresponding to the model are obtained, trimming the first skeletons in the end triangles.

5. The geometric structure analyzing method of claim 4, wherein when the first skeletons in the end triangles are trimmed, some of the first connecting points are merged to form new first connecting points, wherein a number of triangles passed by connecting lines connected by the some of the first connecting points are less than a specific threshold.

6. A geometric structure analyzing system, comprising at least one magnetic building block, a magnetic field sensor that obtains a magnetic field intensity image of a model composed of the magnetic building block, and a calculating device that constructs a two-dimensional geometric structure of the model according to the magnetic field intensity image by using the geometric structure analyzing method of any one of claims 1-5 and displays the two-dimensional geometric structure.

7. The geometric structure analyzing system of claim 6, wherein the magnetic building block is a round-corner cuboid, and two magnets kept in the same polarity are installed in the magnetic building block.

8. The geometric structure analyzing system of claim 7, wherein the two magnets are spaced at a minimum distance such that magnetic fields respectively generated by the two magnets are merged to form a single magnetic field and a shape of a magnetic field intensity image of the two magnets generated by the magnetic field sensor is similar to a shape of the magnetic building block.

9. The geometric structure analyzing system of claim 7, wherein the magnetic building block has a gear-shaped male connector and a gear-shaped female connector disposed on an outer side thereof, the gear-shaped male connector and the gear-shaped female connector are disposed on two sides of at least one of the two magnets, and the gear-shaped male connector and the gear-shaped female connector have corresponding sizes and numbers of teeth and are configured to be engaged with each other.

10. The geometric structure analyzing system of claim 6, wherein the magnetic building block is a cylinder having a magnet installed therein.

11. The geometric structure analyzing system of claim 6, wherein the magnetic building block is engaged with an actuator that controls deformation of the model composed of the magnetic building block.

12. The geometric structure analyzing system of claim 6, wherein the magnetic building block is adhered with a conductive tape such that the magnetic building block, when used on the calculating device, performs a multi-touch function.

13. The geometric structure analyzing system of claim 6, wherein the magnetic building block is adhered with a fiber optics bundle such that an image displayed on the calculating device is displayed through the fiber optics bundle on a surface of the magnetic building block.

14. A computer program product comprising a non-statutory computer readable medium to execute a geometric structure analyzing method that analyzes a two-dimensional geometric structure of a model composed of at least one magnetic building block, the computer program product comprising:

a first program code that obtains a magnetic field intensity image of the model and uses a shape of the magnetic field intensity image as a contour of the model;

a second program code that triangularly divides the contour according to a first algorithm to obtain in the contour a plurality of end triangles, a plurality of normal triangles and a plurality of junction triangles;

a third program code that skeletonizes the end triangles, the normal triangles and the junction triangles according to a second algorithm to obtain a plurality of first skeletons and a plurality of first connecting points corresponding to the model;

a fourth program code that connects the first connecting points in the junction triangles with an end of each of the first skeletons in the normal triangles neighboring the end triangles to obtain a plurality of second skeletons and a plurality of second connecting points; and a fifth program code that cuts at least one of the second skeletons that is longer than the magnetic building block to form a plurality of third skeletons and at least one third connecting point, and trims remaining ones of the second skeletons, thereby using the third connecting point, the second connecting points, the second skeletons and the third skeletons as skeletons and joints of the two-dimensional geometric structure of the model.

* * * * *